United States Patent
Anand et al.

(10) Patent No.: US 9,281,045 B1
(45) Date of Patent: Mar. 8, 2016

(54) REFRESH HIDDEN EDRAM MEMORY

(71) Applicant: International Business Machines Corporation, Armonk, NY (US)

(72) Inventors: Darren L. Anand, Williston, VT (US); Venkatraghavan Bringivijayaraghavan, Cheyyar (IN); Krishnan S. Rengarajan, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/571,496

(22) Filed: Dec. 16, 2014

(51) Int. Cl.
*G11C 11/24* (2006.01)
*G11C 11/406* (2006.01)
*G11C 11/4091* (2006.01)
*G11C 11/4093* (2006.01)
*G11C 11/4094* (2006.01)
*G11C 11/4096* (2006.01)

(52) U.S. Cl.
CPC .......... *G11C 11/406* (2013.01); *G11C 11/4091* (2013.01); *G11C 11/4093* (2013.01); *G11C 11/4094* (2013.01); *G11C 11/4096* (2013.01); *G11C 11/40618* (2013.01)

(58) Field of Classification Search
CPC .... G11C 11/24; G11C 11/401; G11C 11/406; G11C 11/40618; G11C 11/40622; G11C 11/4091; G11C 11/4093; G11C 11/4094; G11C 11/4096
USPC ........... 365/189.05, 149, 189.04, 222, 230.03
See application file for complete search history.

(56) References Cited

U.S. PATENT DOCUMENTS

| | | | | |
|---|---|---|---|---|
| 5,818,777 | A | * | 10/1998 | Seyyedy .............. G11C 11/406 365/222 |
| 5,875,452 | A | * | 2/1999 | Katayama ............ G11C 7/1018 365/189.05 |
| 5,887,272 | A | | 3/1999 | Sartore et al. |
| 6,005,818 | A | | 12/1999 | Ferrant |
| 6,330,636 | B1 | | 12/2001 | Bondurant et al. |
| 6,707,743 | B2 | | 3/2004 | Leung et al. |
| 7,688,662 | B2 | | 3/2010 | Mobley |
| 8,151,044 | B2 | | 4/2012 | Proesbsting |
| 8,190,808 | B2 | | 5/2012 | Lai et al. |

(Continued)

OTHER PUBLICATIONS

Huang et al., "Low-Power 2P2N SRAM With Column Hidden Refresh," IEEE, 2002, p. 591-594, Department of Electronic Engineering, Fu-Jen University, Taiwan.

IBM, "IBM Customer Connect," Online customer tools, https://www-03.ibm.com/technologyconnect/index.jsp, Accessed on Oct. 1, 2014.

(Continued)

*Primary Examiner* — Tan T Nguyen
(74) *Attorney, Agent, or Firm* — Catherine Ivers; Andrew M. Calderon; Roberts Mlotkowski Safran & Cole, P.C.

(57) ABSTRACT

A first data access request to a first row of a first memory array of the DRAM is received while a refresh operation in the first memory array is executing. The refresh operation is paused. The first data access request is executed, and simultaneously, the bits of the first row of the first memory array, including any updates indicated in the first data access request, are latched to a transfer register. The bits latched to the transfer register are written to a corresponding first row in a second memory array of the DRAM. A bank select logic is updated to indicate that subsequent data access requests to the first row in the first memory array will be executed from the second memory array. The refresh operation is then resumed.

12 Claims, 11 Drawing Sheets

(56) References Cited

U.S. PATENT DOCUMENTS

2003/0161207 A1    8/2003    Jones, Jr. et al.
2006/0190678 A1    8/2006    Butler et al.

OTHER PUBLICATIONS

Vamvakos et al., "A 576 Mb DRAM with 16-channel 10.3125Gbps serial I/O and 14.5 ns latency," IEEE, 2012, p. 458-461, MoSys Inc., Santa Clara, CA.

* cited by examiner

Refresh Bank A Interrupted by a Read to Bank A

Refresh Bank A Interrupted by Back-to-Back Reads to Bank A – Same Row

Refresh Bank A Interrupted by Back-to-Back Reads to Bank A – Different Rows

Refresh Bank A Interrupted by Back-to-Back Writes to Bank A – Same Row

Refresh Bank A Interrupted by Back-to-Back Writes to Bank A – Different Rows

Refresh Bank A Interrupted by Read Followed by Write to Bank A – Same Row

Refresh Bank A Interrupted by Write Followed by Read to Bank A – Same Row

REFRESH HIDDEN EDRAM MEMORY

BACKGROUND

The present invention relates generally to dynamic random memory (DRAM) systems, and more particularly to refresh operations in DRAM systems.

SUMMARY

Embodiments of the present invention disclose a method and system for operating a DRAM. A first data access request to a first row of a first memory array of the DRAM is received while a refresh operation in the first memory array is executing. The refresh operation is paused. The first data access request is executed, and simultaneously, the bits of the first row of the first memory array, including any updates indicated in the first data access request, are latched to a transfer register. The bits latched to the transfer register are written to a corresponding first row in a second memory array of the DRAM. A bank select logic is updated to indicate that subsequent data access requests to the first row in the first memory array will be executed from the second memory array. The refresh operation is then resumed.

DETAILED DESCRIPTION

Figure 1:
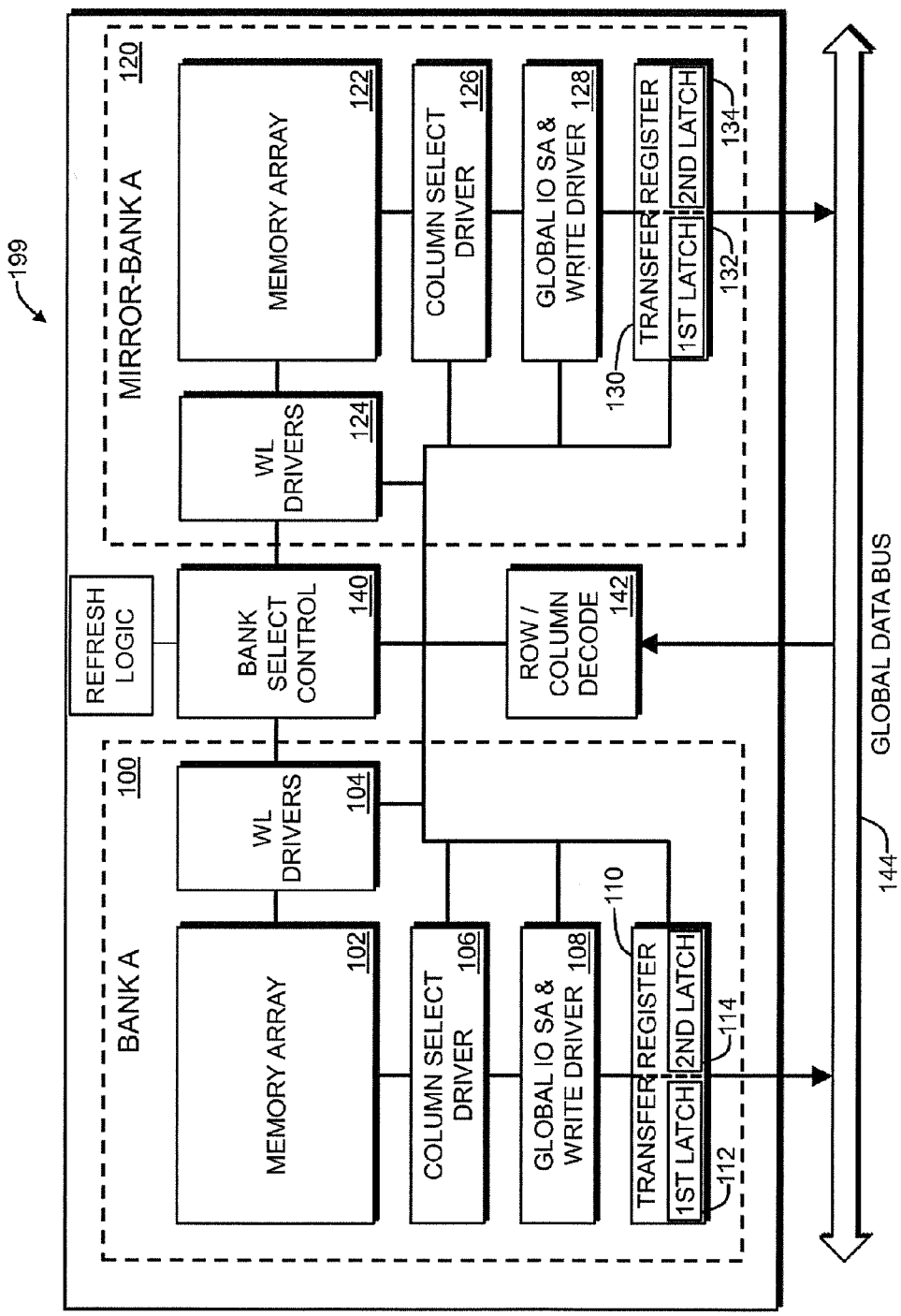
FIG. 1 is a functional schematic diagram of a DRAM, in accordance with an embodiment of the present invention.

Dynamic random access memory (DRAM) cells need to be refreshed from time-to-time to restore leaking charge and thus maintain their logic state. That is, it is necessary to perform a specified number of refresh operations within a predetermined period of time in order to hold data in DRAM memory in an activated state. Memory refresh operations periodically read information from an area of DRAM and immediately rewrite the read information to the same area without modification, for the purpose of preserving the information. Memory refresh is required in DRAM, the most widely used type of computer memory, and is one of the defining characteristic of this class of memory. In a DRAM chip, each bit of memory data is stored as the presence or absence of an electric charge on a small capacitor on the chip. As time passes, the charge in the memory cells leaks away. Without being refreshed, the stored data would eventually be lost. To prevent this, internal circuitry may periodically read each cell and rewrite it, restoring the charge on the capacitor to its original level. Each memory refresh cycle refreshes a succeeding area of memory cells, for example, a "row" thus refreshing all the cells in a series of consecutive cycles. This process is typically conducted automatically in the background by the DRAM circuitry, and is usually transparent to the user. However, while a refresh cycle is occurring, the memory is typically not available for normal read and write operations. This impacts the memory availability, lowering bandwidth or requiring a higher operating frequency to compensate. As computer performance has improved, and memory access times have decreased, this refresh overhead time may become a negative factor in DRAM operation.

In embodiments of the invention, each DRAM includes primary memory banks and corresponding mirror banks. A primary bank's write line (WL) drivers, column select drivers, global IO sense amplifiers and write drivers are also mirrored. A primary bank and its corresponding mirror bank each include a transfer register, which further includes a master and slave latches. Each transfer register taps into the memory bank's data path of each bit in a row, right after the array boundary, so that for all data read or written, the data is latched into at least the master latch as the access happens. This operation prospectively latches the read or written data in anticipation of a row refresh conflict. The DRAM also includes bank select control logic at the row address level.

The primary and mirror memory banks perform periodic row-by-row refresh operations. If a row refresh operation in, for example, the primary bank is conflicted by a read to the row, the refresh may be suspended and the read is executed. Simultaneously, that is, at or about the same time and at least within the same clock cycle, the data may be latched into the primary bank's transfer register. The refresh may then resume with the row at which the conflict occurred. At the next opportunity, for example, if the next operation is not a write to the same row, the data in the primary bank's transfer register may be written to the corresponding row in the mirror bank, and the bank select control logic may be updated to indicate that subsequent data accesses to this row should now occur in the mirror bank. If the next access is a read to the same row, this read may take place from the transfer register, as the write from the transfer register to the corresponding row in the mirror bank will complete on the next cycle. Subsequent data accesses to the row may take place in the mirror bank. If the next data access operation is a write to the same row, the write may take place in the transfer register and writing the primary bank transfer register data to the mirror bank may be delayed. These and other combinations of data access that conflict a row refresh are described in more detail below.

While the memory array locations in each primary bank are mirrored in their corresponding mirror banks, the data is typically not. A row will be valid in either a primary bank or its mirror bank. The row may remain valid in either the primary bank or its mirror bank until a refresh to the row is conflicted by an access to the row. Then, the refresh is paused, the access is executed while a swap of the row to its corresponding mirror bank or primary bank is initiated, and the refresh resumes at the conflicted row. Subsequent accesses to the conflicted row will now execute in the bank to which the row was swapped. The refresh cycles of each bank are asynchronous to the refresh cycles of the other banks.

Embodiments of the present invention will now be described in detail with reference to the accompanying drawings.

FIG. 1 is a functional schematic diagram of a DRAM 199, in accordance with an embodiment of the present invention. DRAM 199 includes bank A 100, mirror-bank A 120, bank select control logic 140, row-column decode logic 142, and global data bus 144. In practice, there may be numerous banks with corresponding mirror banks in a DRAM. For illustration purposes, a single bank A and its mirror-bank A are shown.

Bank A 100 further includes memory array 102, write line (WL) drivers 104, column select driver 106, global IO sense amps (SA) and write driver 108, and transfer register 110 with first (master) latch 112 and second (slave) latch 114. Similarly, mirror-bank A further includes memory array 122, write line (WL) drivers 124, column select driver 126, global IO sense amps and write driver 128, and transfer register 130 with first (master) latch 132 and second (slave) latch 134.

In various embodiments, memory arrays 102/122 represent any suitable configuration and/or implementation of DRAM memory arrays, in accordance with an embodiment of the invention. These embodiments will typically include storage cells connected to word lines (rows) and bit-lines (columns). Write line drivers 104/124 and column select drivers 106/126 operate to assert control signals on the write lines and bit-lines, respectively, of memory arrays 102/122 to select specific storage cells in the arrays for access. Global IO sense amp and write drivers 108/128 sense and latch bit data from the selected memory array 102/122 storage cells and drive the bit data onto the global data bus 144, or sense and latch data from the global data bus 144 and write the data into selected memory array 102/122 storage cells.

Transfer registers 110/130 include master latches 112/132 and slave latches 114/134. In various embodiments, transfer registers 110/130 may operate as shift registers, or muxed latches. The transfer registers 110/130 tap into each bit of the data paths from global IO sense amp and write drivers 108/128, for example, right after the sense amps, such that for all data read or written between the global IO sense amp and write drivers 108/128 and global data bus 144, the data is simultaneously latched into at least the first (master) latches 112/132 as the access happens. As described in more detail below, a write of the latched data in a transfer register 110 or 130 to the proper row in the other bank's memory array may be initiated in the next cycle, and completed in the following cycle. The write from the transfer register to the other bank's memory array may be executed via, for example, the sense amps of the other bank's global IO sense amp and write drivers 108 or 128. If back-to-back accesses to different rows in a memory array occur, the row data for the second access is latched to the transfer register's second (slave) latch, as the transfer of data in the master latch to the other bank's memory array will not complete until the next cycle. Flags in the transfer register may indicate whether a transfer from a latch to a row in the other bank has completed. As mentioned above, various embodiments, in anticipation of a row refresh conflict, prospectively latch memory array row data that is read or written.

Row/column decode logic 142 operates to receive access requests on global data bus 144. The row decode signals, derived from an access request, are asserted to bank select control logic 140, WL drivers 104 of bank A, and WL drivers 124 of mirror bank A. Based on logic stored in bank select control logic 140 and on the row address of the access request, the bank select control logic fires the appropriate bank A or mirror bank A write line driver of WL drivers 104 or 124.

In various embodiments, the physical layout of the DRAM, for example, DRAM 199, may include placement of an array bank, for example, bank A 100, and its mirror bank, for example, mirror bank A 120, across a "spine" of array read/write circuits, for example, bank select control logic 140, row/column decode logic 142, and WL drivers 104/124. This physical layout may, among other things, advantageously minimize the routes and distances between the transfer registers 110/130. Other aspects related to an exemplary hardware implementation are described below in relation to FIG. 11.

Figure 2:
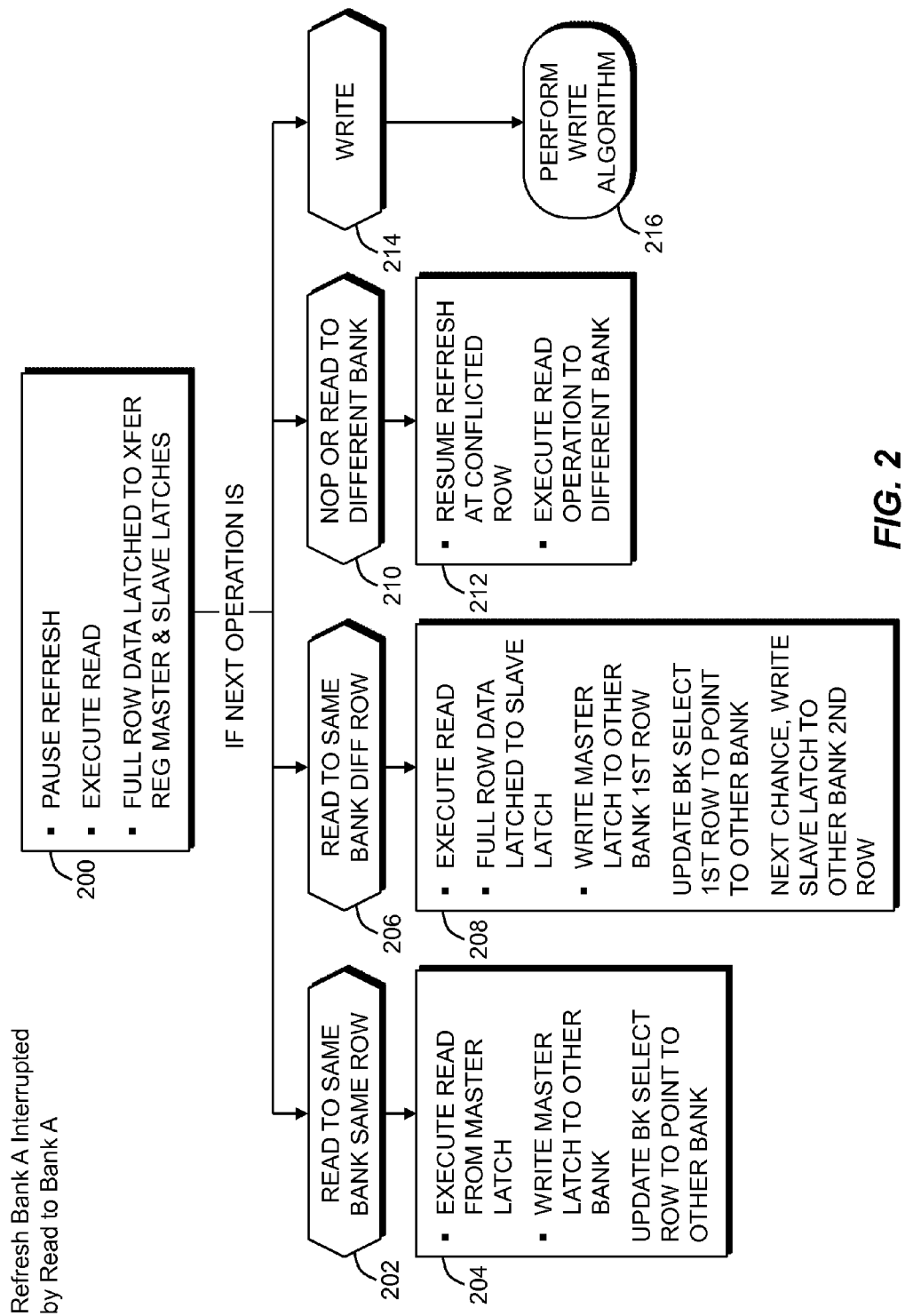
FIG. 2 is a flowchart depicting operational steps of the DRAM of FIG. 1 when a refresh operation to a row is interrupted by a read access to the row, in accordance with an embodiment of the present invention.

FIG. 2 is a flowchart depicting operational steps of DRAM 199 of FIG. 1 when a refresh operation to a row in a memory array is interrupted by a read access to the row, in accordance with an embodiment of the present invention. While a refresh operation in, for example, memory array 102 of bank A 100 is executing, a read access request to bank A may be detected on global data bus 144. For example, the read access request may be detected by row/column decode logic 142, which asserts the row and column signals to WL drivers 104/124 and column select drivers 106/126. The row signal is also received by bank select control logic 140, which, based on logic stored in bank select control logic 140 and on the row address of the read access request, fires (in this example) the appropriate bank A write line driver of WL drivers 104.

If the read access request collides with the bank A 100 refresh operation—for example, the read access request is to a memory location on the row that is in bank A—the refresh is paused, the read access is executed, and simultaneously the full row data is latched into the bank A 100 transfer register 110 master latch 112 and slave latch 114 (step 200). Row address may also be stored in the transfer registers along with the row data.

If the next operation is a read access to the same bank and same row (step 202)—in this example, to the same row in bank A—then the second read is executed from the master latch, which simultaneously has initiated the process of writing the latched row data to the corresponding row in the memory array 122 of mirror-bank A 120. At the next cycle, when the write has completed, bank select control logic 140 is updated such that subsequent accesses to this row will cause the row's WL driver 124 for mirror-bank 120 to fire (step 204).

If the next operation is a read access to the same bank but a different row (step 206)—in this example, a different row in bank A—then the second read access is executed, and simultaneously the full row data is latched into the bank A 100 transfer register 110 slave latch 114 (step 208). Row address may also be stored in the transfer registers along with the row data.

The process of writing the first read row data that is latched into the master latch 112 to the corresponding row in the memory array 122 of mirror-bank A 120 is initiated. At the next cycle, when this write has completed, bank select control logic 140 is updated such that accesses to data in the first read row will cause the row's WL driver 124 for mirror-bank 120 to fire. At the next opportunity, which may be the next cycle, the process of writing the second read row data that is latched into the slave latch 114 to the corresponding row in the memory array 122 of mirror-bank A 120 is initiated, and, when the write has completed, bank select control logic 140 is updated such that subsequent accesses to data in the second read row will cause the row's WL driver 124 for mirror-bank 120 to fire.

If the next operation is a no-op or a read to a row in a different bank (step 210), i.e., not to bank A, then the refresh is resumed at the conflicted row (step 212), and the read is executed to the other bank in accordance with steps 200-208 above.

Figure 3:
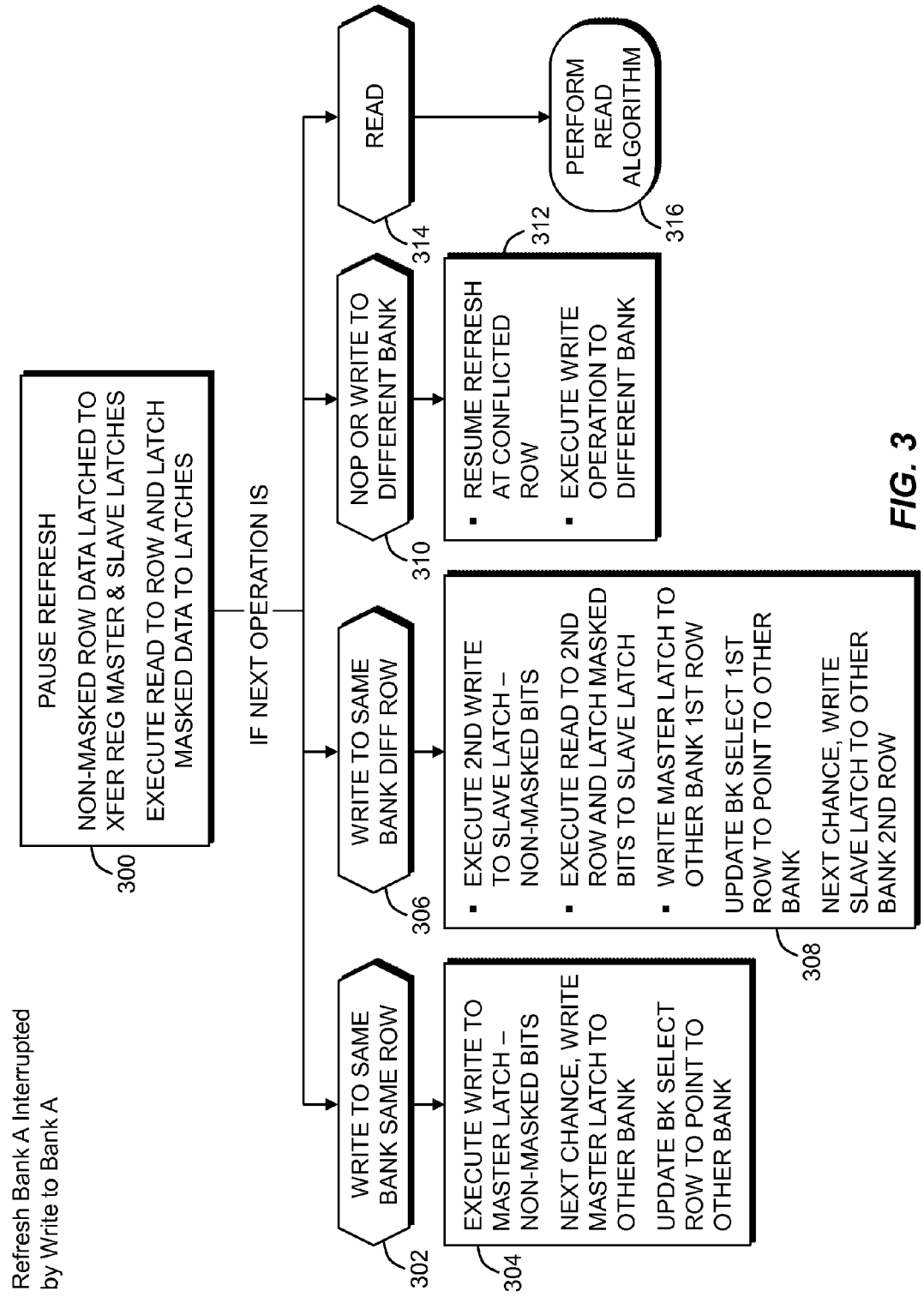
FIG. 3 is a flowchart depicting operational steps of the DRAM of FIG. 1 when a refresh operation to a row is interrupted by a write access to the row, in accordance with an embodiment of the present invention.

If the next operation is a write (step 214), the steps described in relation to FIG. 3 are performed (step 216).

FIG. 3 is a flowchart depicting operational steps of DRAM 199 of FIG. 1 when a refresh operation to a row is interrupted by a write access to the row, in accordance with an embodiment of the present invention. Similar to the processes described above in relation to FIG. 2, while a row-by-row refresh operation in, for example, memory array 102 of bank A 100 is executing, a write access request to bank A may be detected on global data bus 144. For example, the write access request may be detected by row/column decode logic 142, which asserts the row and column signals to WL drivers 104/124 and column select drivers 106/126. The row signal is also received by bank select control logic 140, which, based on logic stored in bank select control logic 140 and on the row address of the read access request, fires (in this example) the appropriate bank A write line driver of WL drivers 104.

If the write access request collides with the bank A 100 refresh operation—for example, the write access request is to a memory location on the row in bank A—the refresh is paused. The non-masked row data bits from the write access request on global data bus 144 are latched into the bank A 100 transfer register 110 master latch 112 and slave latch 114, and a read to the row in bank A 100 is executed to latch the masked data bits from the sense amps into the transfer register 110 latches (step 300). Row address may also be stored in the transfer registers along with the row data.

If the next operation is a write access to the same bank, same row (step 302)—in this example, to the same row in bank A—then the second write is executed to master latch 112, which may update the unmasked bits of the write in the master latch. At the next opportunity, which may be the next cycle, writing of the data that is latched in the master latch 112 to the corresponding row in the memory array 122 of mirror-bank A 120 is initiated, and, when this write has completed, bank select control logic 140 is updated such that subsequent accesses to data in the row will cause the row's WL driver 124 for mirror-bank 120 to fire.

If the next operation is a write access to the same bank but a different row (step 306)—in this example, a different row in bank A—then the write access is executed, and simultaneously the full row data is latched into the bank A 100 transfer register 110 slave latch 114, and writing of the first write row data that is latched into the master latch 112 to the corresponding row in the memory array 122 of mirror-bank A 120 is initiated (step 308). At the next cycle, when this write has completed, bank select control logic 140 is updated such that accesses to data in the first write row will cause the row's WL driver 124 for mirror-bank 120 to fire. At the next opportunity, which may be the next cycle, the process of writing the second write row data that is latched into slave latch 114 to the corresponding row in the memory array 122 of mirror-bank A 120 is initiated. When the write has completed, bank select control logic 140 is updated such that accesses to data in the second read row will cause the row's WL driver 124 for mirror-bank 120 to fire.

If the next operation is a no-op or a write to a row in a different bank (step 310), i.e., not to bank A, then the refresh is resumed at the conflicted row (step 312), and the write is executed to the other bank, in accordance with steps 300-308 above.

If the next operation is a read (step 314), the steps described in relation to FIG. 2 are performed (step 316).

FIGS. 4-10 are timing diagrams illustrating examples of several access request patterns to a DRAM, for example, DRAM 199 of FIG. 1, that includes a bank A 100 and a corresponding mirror bank A 120.

Figure 4:
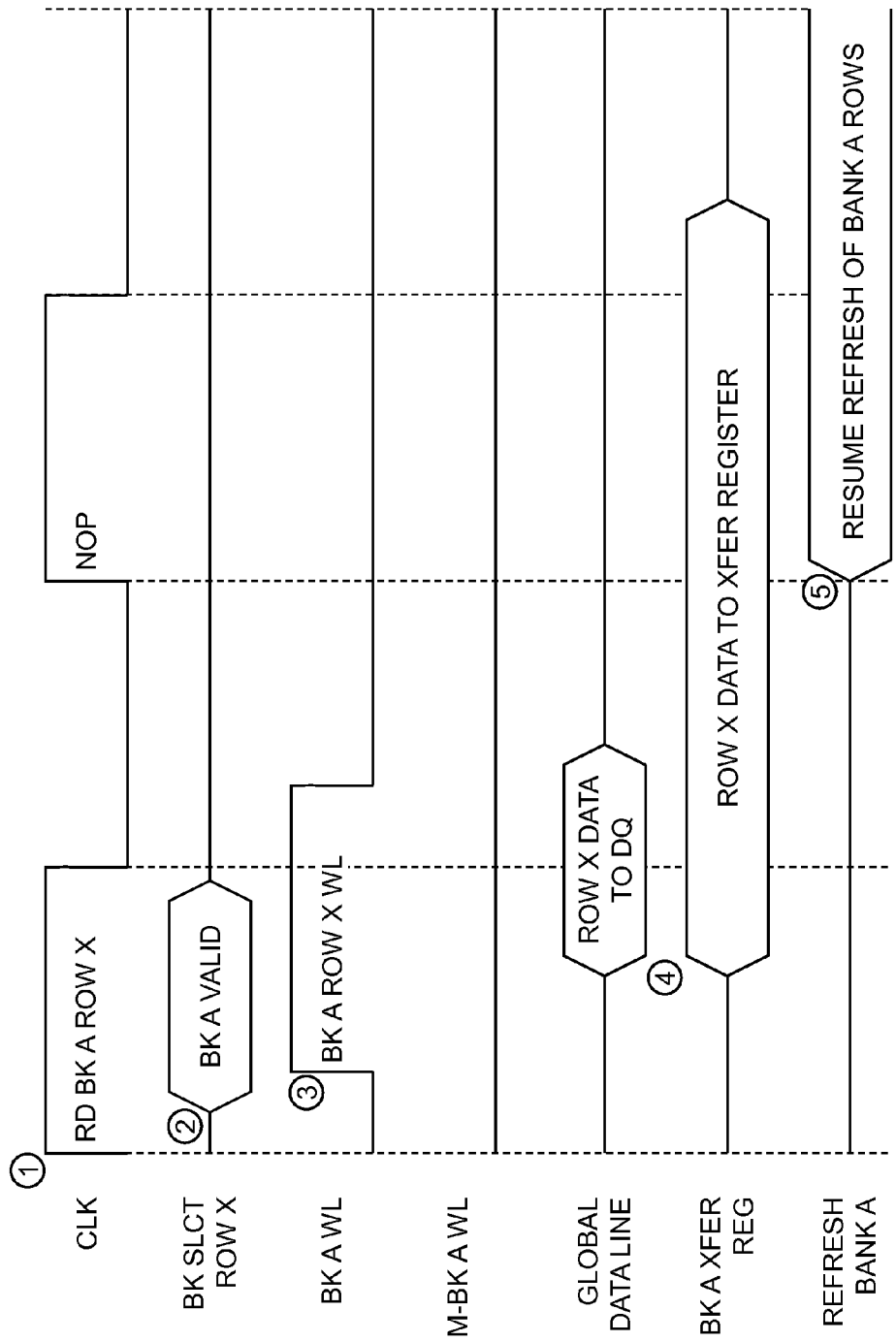
FIG. 4 is a timing diagram for a refresh operation of a row of a bank of a DRAM, interrupted by a read to the row, in accordance with an embodiment of the present invention.

FIG. 4 is a timing diagram for a refresh operation of a row of bank A 100 of DRAM 199, interrupted by a read to the row, in accordance with an embodiment of the present invention. At event 1, a read request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X data in memory array 102 of bank A 100 is written to global data bus 144. Simultaneously, the row X data is latched in the bank A transfer register 110 master and slave latches 112/114. At event 5, because a back-to-back access to the same row is not detected, the row-by-row refresh of memory array 102 resumes at row X.

Figure 5:
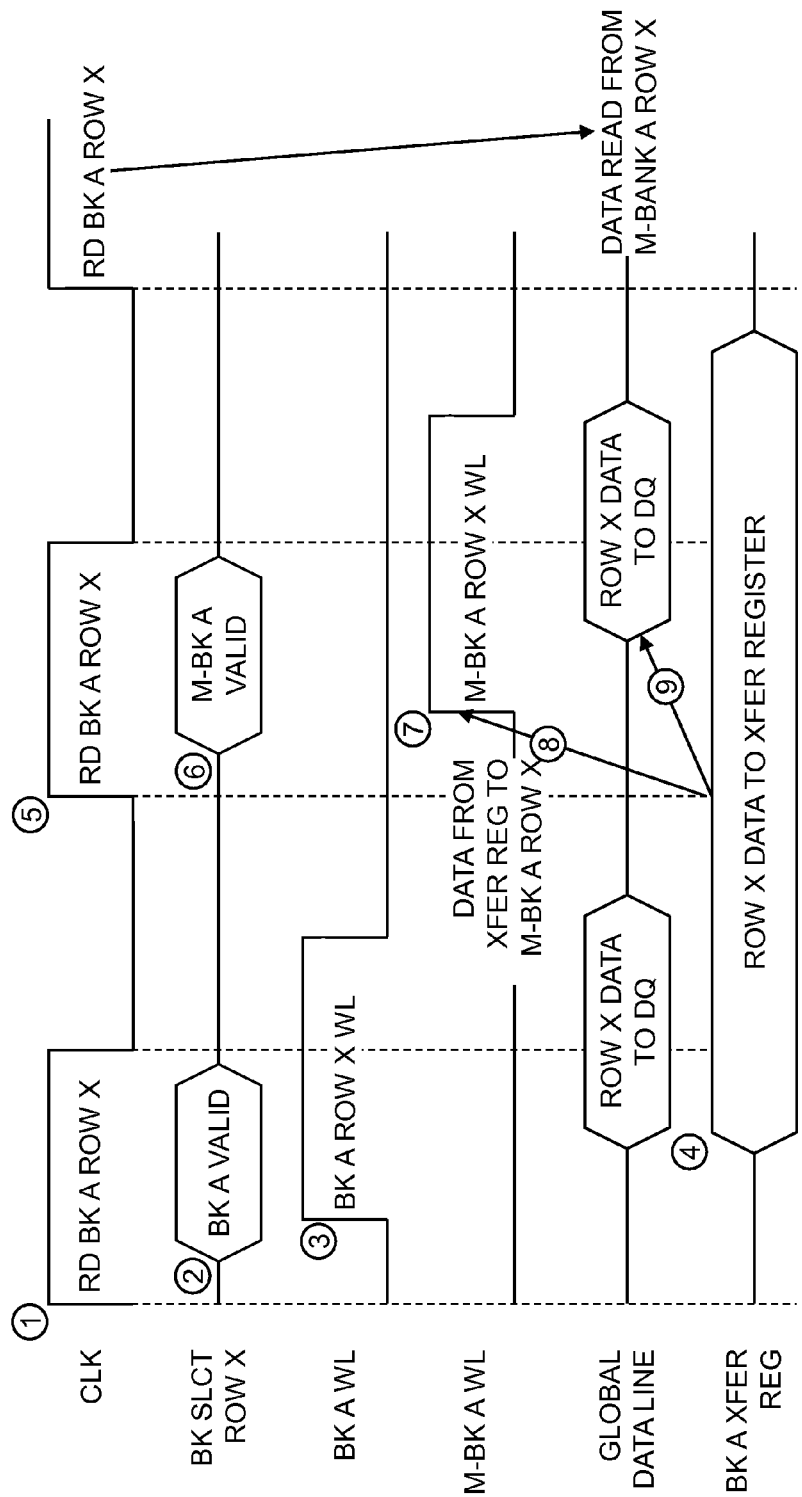
FIG. 5 is a timing diagram for a refresh operation of a row of a bank of a DRAM, interrupted by back-to-back reads to the same row, in accordance with an embodiment of the present invention.

FIG. 5 is a timing diagram for a refresh operation of a row of bank A 100 of DRAM 199, interrupted by back-to-back reads to the same row, in accordance with an embodiment of the present invention. At event 1, a read request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X data in memory array 102 of bank A 100 is written to global data bus 144. Simultaneously, the row X data is latched to the bank A transfer register 110 master and slave latches 112/114.

At event 5, a second read access to row X is detected. At event 6, writing to mirror-bank A 120 of the read data latched to transfer register 110 of bank A 100 is initiated with bank select control logic 140 firing for the mirror-bank A 120 row X write line driver in WL drivers logic 124. At event 7, the mirror-bank A 120 row X write line driver in WL drivers logic 124 is asserted. At event 8, the row X data latched in transfer register 110 is written to row X of memory array 122 of mirror-bank A 120. At event 9, the second read is executed from transfer register 110 of bank A 100. Bank select control logic 140 is updated so that subsequent accesses to row X will take place in mirror-bank 120.

Figure 6:
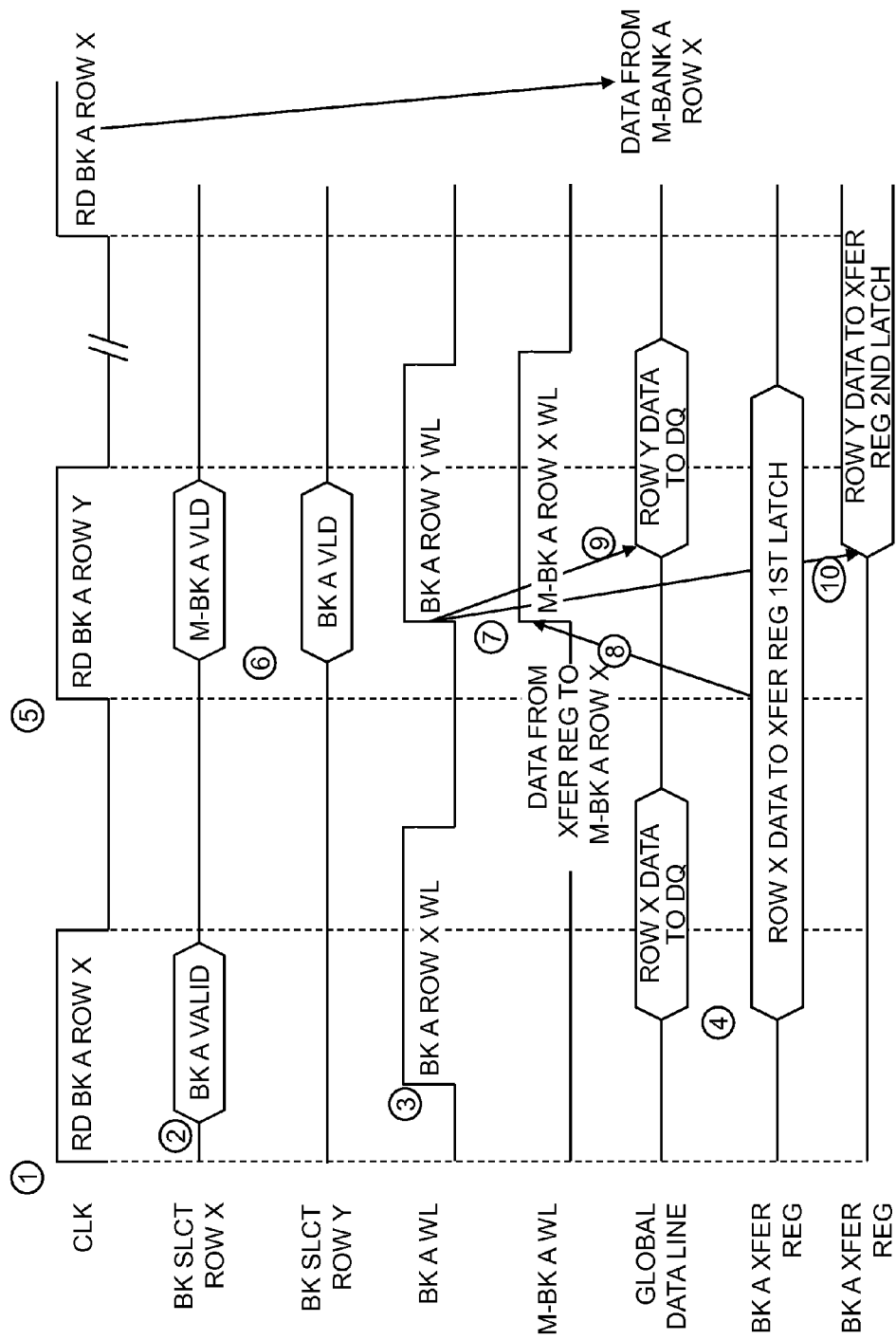
FIG. 6 is a timing diagram for a refresh operation of a row of a bank of a DRAM, interrupted by a read to the row followed by a back-to-back read to a different row of the bank, in accordance with an embodiment of the present invention.

FIG. 6 is a timing diagram for a refresh operation of a row of bank A 100 of DRAM 199, interrupted by a read to the row followed by a back-to-back read to a different row of bank A, in accordance with an embodiment of the present invention. At event 1, a read request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X data in memory array 102 of bank A 100 is written to global data bus 144. Simultaneously, the row X data is latched to the bank A transfer register 110 master and slave latches 112/114.

At event 5, a read access to a row Y is detected. At event 6, writing to mirror-bank A 120 of the read data latched to master latch 112 of transfer register 110 of bank A 100 is initiated with bank select control logic 140 firing for the mirror-bank A 120 row X write line driver in WL drivers logic 124. Simultaneously, bank select control logic 140 fires for the bank A 100 row Y write line driver in WL drivers logic 104. At event 7, both the bank A 100 row Y write line driver in WL drivers logic 104, and the mirror-bank A 120 row X write line driver in WL drivers logic 124 are asserted. At event 8, the row X data latched in master latch 112 is written to row X of memory array 122 of mirror-bank A 120. At event 9, row Y data in memory array 102 of bank A 100 is written to global data bus 144. Simultaneously, at event 10, the row Y data is latched to the bank A transfer register 110 slave 114. Bank select control logic 140 is updated so that subsequent accesses to row X will take place in mirror-bank 120. At the next opportunity, the latched row Y data is similarly written to row Y of mirror-bank 120.

Figure 7:
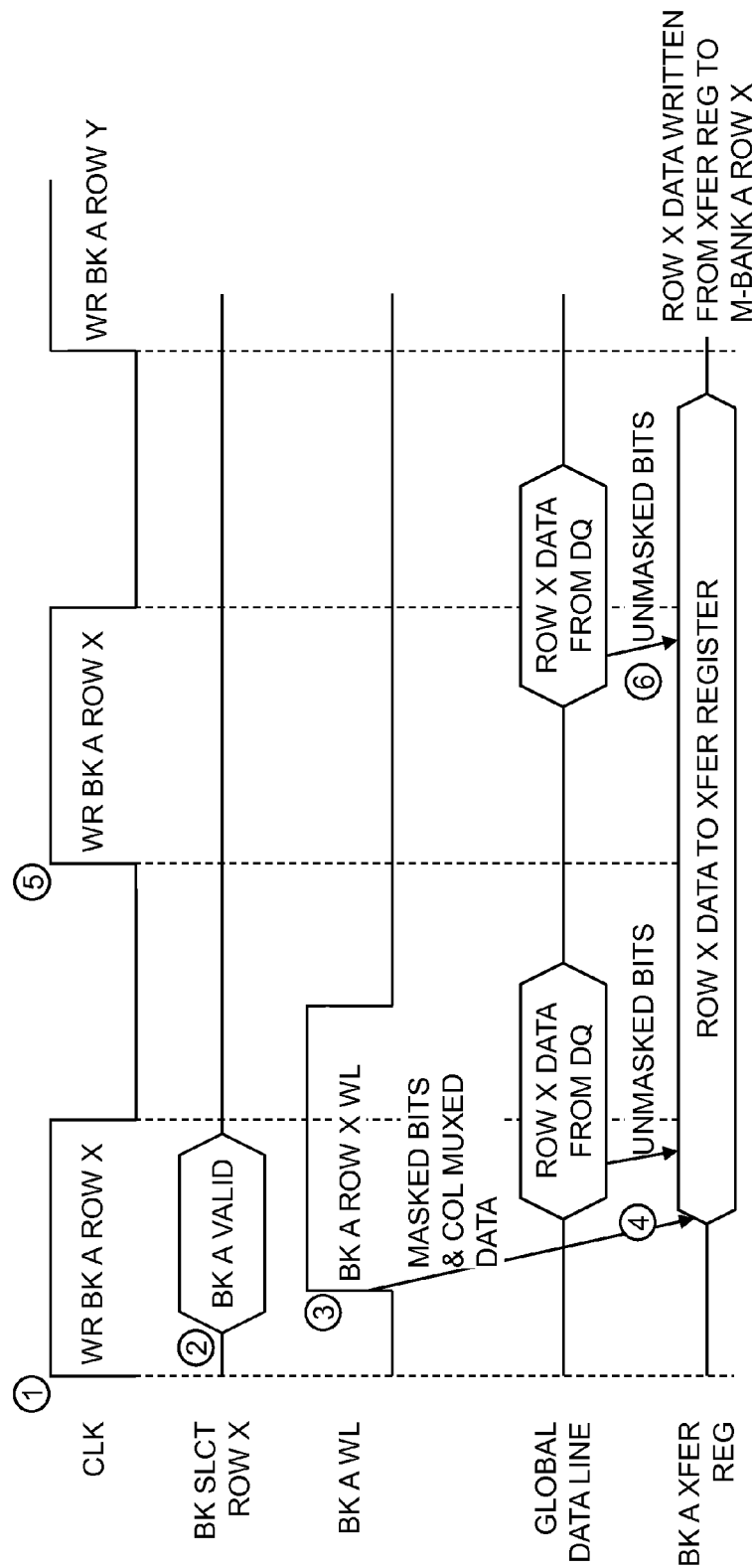
FIG. 7 is a timing diagram for a refresh operation of a row of a bank of a DRAM, interrupted by back-to-back writes to the same row, in accordance with an embodiment of the present invention.

FIG. 7 is a timing diagram for a refresh operation of a row of bank A 100 of DRAM 199, interrupted by back-to-back writes to the same row, in accordance with an embodiment of the present invention. At event 1, a write request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X write data on global data bus 144, which in this example is unmasked bits from a masked write operation, is latched to the bank A transfer register 110 master and slave latches 112/114. Simultaneously, the remaining masked data bits of row X in memory array 102 of bank A 100 are latched to the bank A transfer register 110 master and slave latches 112/114. At event 5, a second write access to row X is detected. At event 6, the latched data in transfer register 110 is updated with the unmasked bits of the write request data on global data bus 144. At the next opportunity, the row X data latched in bank A transfer register 110 is written to row X in mirror-bank A 120, and bank select control logic 140 is updated so that subsequent accesses to row X will take place in mirror-bank 120.

Figure 8:
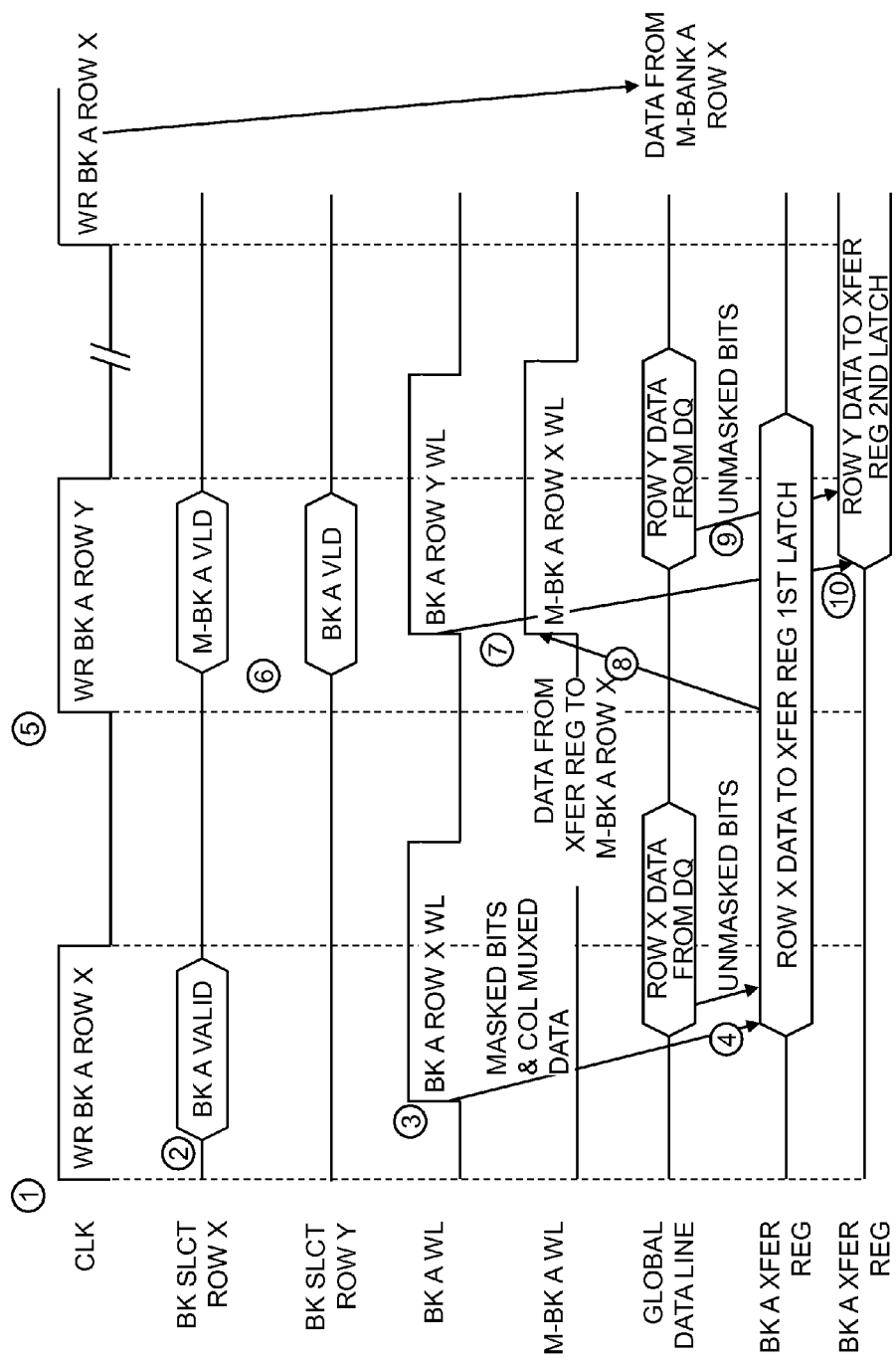
FIG. 8 is a timing diagram for a refresh operation of a row of a bank of a DRAM, interrupted by a write to the row followed by a back-to-back write to a different row of the bank, in accordance with an embodiment of the present invention.

FIG. 8 is a timing diagram for a refresh operation of a row of bank A 100 of DRAM 199, interrupted by a write to the row followed by a back-to-back write to a different row of the bank, in accordance with an embodiment of the present invention. At event 1, a write request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X write data on global data bus 144, which in this example is unmasked bits from a masked write operation, is latched to the bank A transfer register 110 master and slave latches 112/114. Simultaneously, the remaining masked data bits of row X in memory array 102 of bank A 100 are latched to the bank A transfer register 110 master and slave latches 112/114.

At event 5, a write access to a row Y is detected. At event 6, writing to mirror-bank A 120 of the write data latched to master latch 112 of transfer register 110 of bank A 100 is initiated with bank select control logic 140 firing for the mirror-bank A 120 row X write line driver in WL drivers logic 124. Simultaneously, bank select control logic 140 fires for the bank A 100 row Y write line driver in WL drivers logic 104. At event 7, both the bank A 100 row Y write line driver in WL drivers logic 104, and the mirror-bank A 120 row X write line driver in WL drivers logic 124 are asserted. At event 8, the row X data latched in master latch 112 is written to row X of memory array 122 of mirror-bank A 120. At event 9, row Y write data on global data bus 144, which in this example is unmasked bits from a masked write operation, is latched to the bank A transfer register 110 slave latch 114. Simultaneously, at event 10, the remaining masked data bits of row Y in memory array 102 of bank A 100 are latched to the bank A transfer register 110 slave latch 114. At the next opportunity, the latched row Y data is similarly written to row Y of mirror-bank 120.

Figure 9:
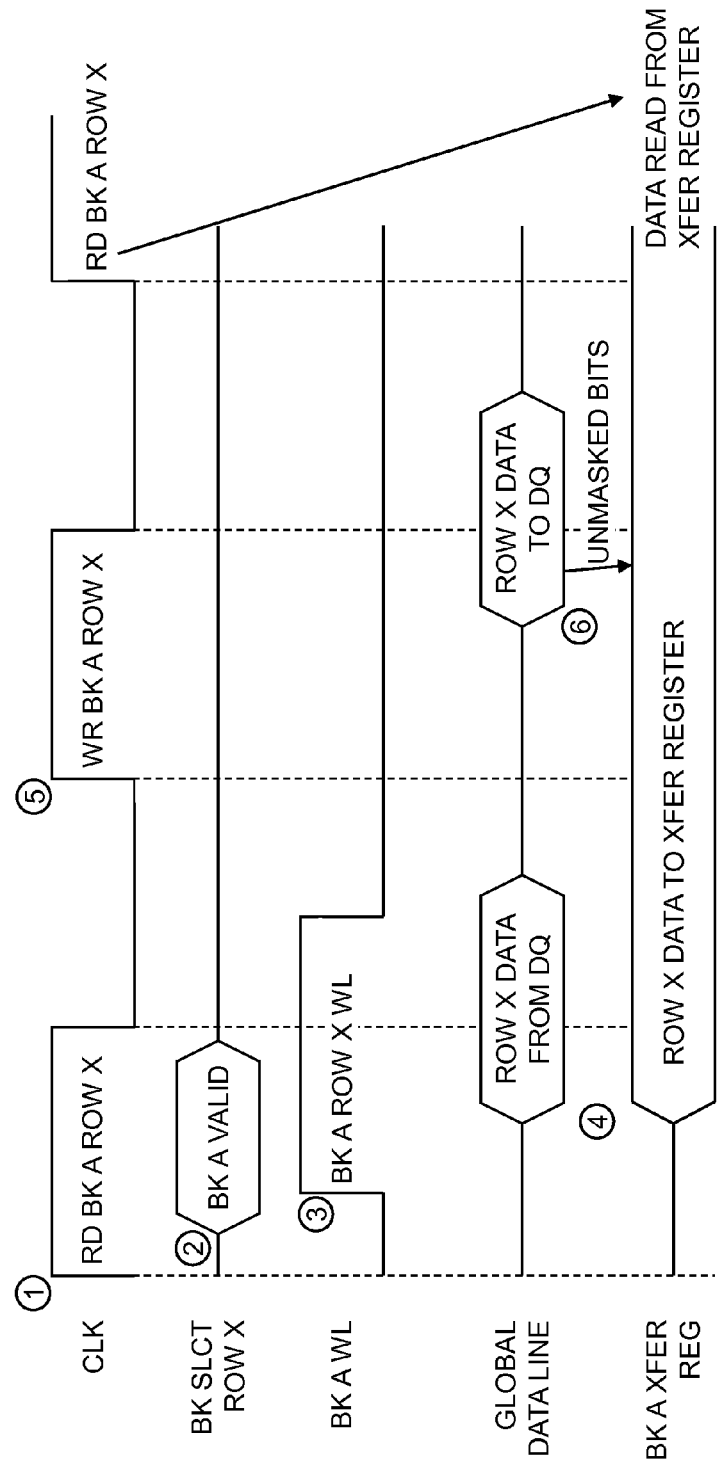
FIG. 9 is a timing diagram for a refresh operation of a row of a bank of a DRAM, interrupted by a read to the row followed by a back-to-back write to the row, in accordance with an embodiment of the present invention.

FIG. 9 is a timing diagram for a refresh operation of a row of bank A 100 of DRAM 199, interrupted by a read to the row followed by a back-to-back write to the row, in accordance with an embodiment of the present invention. At event 1, a read request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X data in memory array 102 of bank A 100 is written to global data bus 144. Simultaneously, the row X data is latched the bank A transfer register 110 master and slave latches 112/114. At event 5, a write access to row X is detected. At event 6, the latched data in transfer register 110 is updated with the unmasked bits of the write request data on global data bus 144. At the next opportunity, the row X data latched in bank A transfer register 110 is written to row X in mirror-bank A 120, and bank select control logic 140 is updated so that subsequent accesses to row X will take place in mirror-bank 120.

Figure 10:
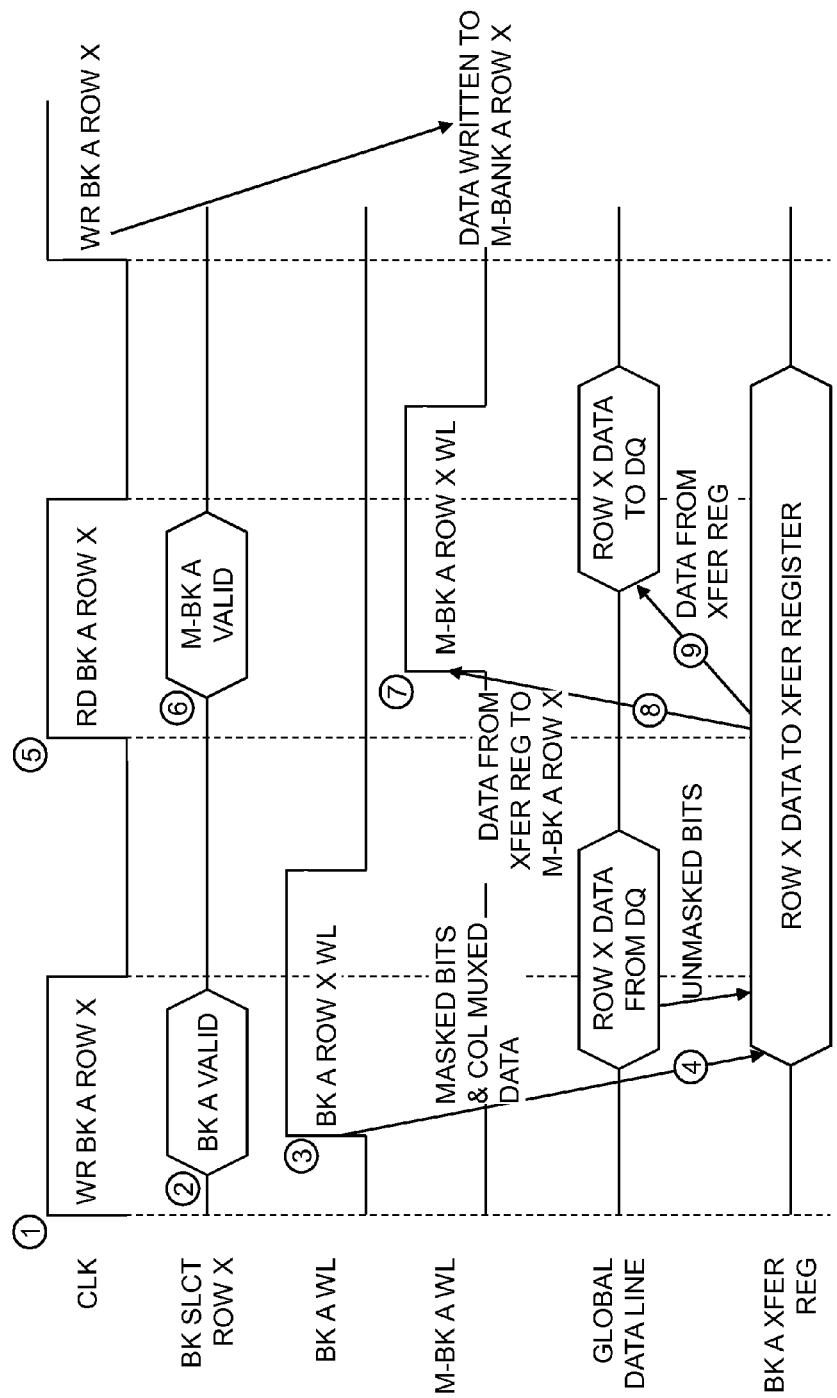
FIG. 10 is a timing diagram for a refresh operation of a row of a bank of a DRAM, interrupted by a write to the row followed by a back-to-back read to the row, in accordance with an embodiment of the present invention.

FIG. 10 is a timing diagram for a refresh operation of a row of bank A 100 of DRAM 199, interrupted by a write to the row followed by a back-to-back read to the row, in accordance with an embodiment of the present invention. At event 1, a write request is detected by row/column decode logic 142 for data located at address row X in DRAM 199. At event 2, based on previously stored logic in bank select control logic 140, the bank select control logic fires for the bank A 100 row X write line driver in WL drivers logic 104. At event 3, the bank A 100 row X write line driver in WL drivers logic 104 is asserted. At event 4, row X write data on global data bus 144, which in this example is unmasked bits from a masked write operation, is latched to the bank A transfer register 110 master and slave latches 112/114. Simultaneously, the remaining masked data bits of row X in memory array 102 of bank A 100 are latched to the bank A transfer register 110 master and slave latches 112/114.

At event 5, a read access to row X is detected. At event 6, writing to mirror-bank A 120 of the read data latched to transfer register 110 of bank A 100 is initiated with bank select control logic 140 firing for the mirror-bank A 120 row X write line driver in WL drivers logic 124. At event 7, the mirror-bank A 120 row X write line driver in WL drivers logic 124 is asserted. At event 8, the row X data latched in transfer register 110 is written to row X of memory array 122 of mirror-bank A 120. At event 9, the read is executed from transfer register 110 of bank A 100. Bank select control logic 140 is updated so that subsequent accesses to row X will take place in mirror-bank 120.

With regards to timing and refresh cycles, worst case scenarios may be constructed based on the various refresh schemes. For example, consider the case where the DRAM consists of two primary banks and two corresponding mirror banks, and the refresh scheme is a simple sequential row-by-row scheme that steps down the first and second primary banks, followed by the first and second mirror banks. Assume that the refresh to the first row in the first primary bank is interrupted by a data access to the row. The refresh will be paused, the data access will be executed, and the accessed row will be latched into the transfer register. A back-to-back access to the same row can be executed from the transfer register and would not interfere with resuming the first primary bank refresh operation at the first row. However, a data access pattern to, for example, successive rows in the first primary bank will cause the refresh to pause as each access is executed at the row of the first primary bank. In this case, each row of the first primary bank will be written to the corresponding row in the first mirror bank. Such a data access pattern will cause a delay of the number of cycles corresponding to the number of rows in the first primary bank.

The row-by-row refresh of the first primary bank may now resume, as any subsequent data accesses, at least for the duration of the first primary bank refresh operation, will not interfere with the refresh of the first primary bank. For example, any data accesses to a row in the first primary bank will be executed from the first mirror bank, and any data accesses to any other bank won't affect the refresh operation of the first primary bank.

After the refresh of the first primary bank completes, the next sequential row to refresh is the first row of the second primary bank. Similar to the situation with the first primary bank, a data access pattern to successive rows in the second primary bank will cause the refresh to pause as each access is executed at the row of the second primary bank, and the data access pattern will cause a delay of the number of cycles corresponding to the number of rows in the second primary bank. If the data access pattern is repeated, the refresh of each mirror bank will be similarly delayed by the number of cycles corresponding to the number of rows in each mirror bank.

In this worst case scenario, the cycles required to refresh each bank are doubled. Because the mirror banks are "hidden" from the user, this worst case appears to be a quadrupling of the non-conflicted refresh best case scenario. Thus, with this simple refresh scheme, the refresh cycle needs to occur at least four times as often to assure that each bank will be refreshed within the refresh time should the worst case scenario occur.

In other embodiments, more sophisticated refresh schemes may be used that have worst case scenarios with less than a quadrupling of their best case refresh cycle counts. For example, because a row will be valid in either the primary bank or its mirror bank, the above simple sequential row-by-row refresh scheme may be modified, for example, using logic stored in bank select control logic 140, to skip the refresh of half of the combined rows in a bank and its mirror bank. In other embodiments, refresh schemes in accordance with various implementations of the invention may incorporate, for example, multi-bank refreshing, refresh staggering, etc.

Figure 11:
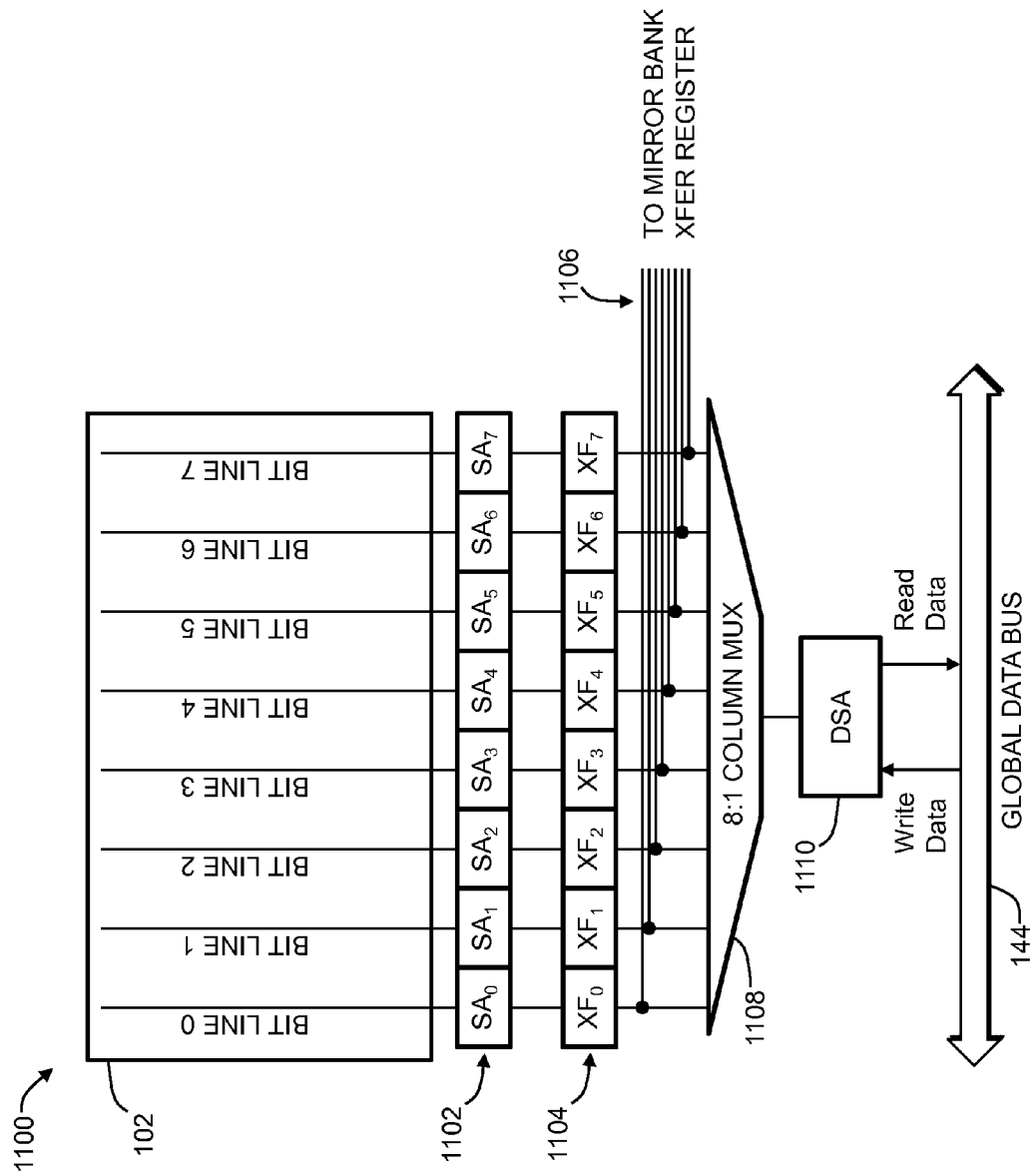
FIG. 11 illustrates a MUX arrangement in a DRAM, in accordance with an embodiment of the present invention.

FIG. 11 is a schematic block diagram illustrating circuit and logic components in a DRAM 1100, in accordance with an embodiment of the present invention. DRAM 1100 includes memory array 102, sense amplifiers 1102, transfer register 1104, mirror bank transfer register connection traces 1106, 8:1 column MUX 1108, data sense amplifier 1110, and global data bus 144. Memory array 102 further includes bit-lines 0-7, which may correspond to the write lines of memory array 102 discussed above in relation to FIG. 1, and may represent the connections to a single global data line. As shown, the eight bit-lines service each global data line through a 8:1 column MUX 1108. Each bit-line is coupled to a sense amplifier 1102. The outputs of sense amplifiers 1102 are coupled to the bits of transfer register 1104, and also to the inputs of 8:1 column MUX 1108. For ease of explanation, transfer register 1104 is shown with a single latch. The outputs of sense amplifiers 1102 are tapped by traces 1106, which are coupled to the bits of the transfer register in a mirror bank (not shown). As illustrated, for example, bit-line 0 is coupled to sense amplifier $SA_0$, the output of which is coupled to transfer register 1104 bit $XF_0$, and is tapped by a trace 1106 to couple to, for example, bit $XF_0$ of the transfer register in the mirror bank. Similarly, bit-lines 1-7 are coupled to sense amplifiers $SA_1$-$SA_7$, the output of which is coupled to transfer register 1104 bit $XF_1$-$XF_7$, and are tapped by traces 1106 to couple to, for example, bit $XF_1$-$XF_7$ of the transfer register in the mirror bank.

During an array read, the sense amplifiers 1102 amplify the read data on bit-lines 0-7 in memory array 102 and buffer the data to the transfer register 1104 bits $XF_0$-$XF_7$. During an array write, DSA 1110 asserts data read from global data bus 144 to one of the sense amplifiers 1102, based on the column output selected by 8:1 column MUX 1108, while the other 7 columns may perform a refresh. During a write from the transfer register 1104, bits $XF_0$-$XF_7$ will buffer the write data to the sense amplifiers 1102, and bit-line write logic will write the full row. During a masked write, data can be accessed from the array or transfer register depending on which location contains the valid data. The architecture enables a read operation from the bank to be sourced from the transfer register or array cells of either the main or mirror bank. During a write operation, the data can be written from the DSA (global data bus) or transfer register or refreshed from the array cells during a masked write. This enables all functions required to manage refresh conflicts.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Based on the foregoing, a computer system, method and program product have been disclosed in accordance with the present invention. However, numerous modifications and substitutions can be made without deviating from the scope of the present invention. Therefore, the present invention has been disclosed by way of example and not limitation.

The foregoing description of various embodiments of the present invention has been presented for purposes of illustration and description. It is not intended to be exhaustive nor to limit the invention to the precise form disclosed. Many modifications and variations are possible. Such modifications and variations that may be apparent to a person skilled in the art of the invention are intended to be included within the scope of the invention as defined by the accompanying claims.

What is claimed is:

1. A method of operating a DRAM, comprising:
   receiving a first data access request to a first row of a first memory array of the DRAM while a refresh operation in the first memory array is executing;
   pausing the refresh operation;
   executing the first data access request, and
   simultaneously latching the bits of the first row of the first memory array, including any updates indicated in the first data access request, to a transfer register;
   writing the bits latched to the transfer register to a corresponding first row in a second memory array of the DRAM;
   updating a bank select logic to indicate that subsequent data access requests to the first row in the first memory array will be executed from the second memory array; and
   resuming the refresh operation.

2. A method in accordance with claim 1,
   wherein the first data access request to the first row of the first memory array is a read access request;
   wherein executing the first data access request further comprises executing the read access request from the first row of the first memory array; and wherein the method further comprises:
receiving a back-to-back second read access request to the first row of the first memory; and
executing the second read access request from the transfer register.

3. A method in accordance with claim 1,
wherein the transfer register includes a first latch and a second latch;
wherein the first data access to the first row of the first memory array is a read access request;
wherein executing the first data access request further comprises executing the read access request from the first row of the first memory array;
wherein latching the bits of the first row of the first memory array to the transfer register further comprises latching the bits in the first row to the first latch of the transfer register;
wherein writing the bits latched to the transfer register to a corresponding first row in a second memory array of the DRAM further comprises writing the bits latched to the first latch of the transfer register to a corresponding first row in a second memory array of the DRAM; and
wherein the method further comprises:
receiving a back-to-back second read access request to a second row in the first memory array;
executing the second read access request from the second row of the first memory array, and
simultaneously latching the bits in the second row to the second latch of the transfer register; and
writing the bits latched to the second latch of the transfer register to a corresponding second row in the second memory array of the DRAM.

4. A method in accordance with claim 1,
wherein the first data access request to the first row of the first memory array is a first masked write access request;
wherein latching the bits of the first row of the first memory array to the transfer register further comprises latching the unmasked bits from the first masked write access request to the transfer register; and
wherein the method further comprises:
executing a read to the first row in the first memory array, and
simultaneously latching the masked bits in the first row to the transfer register;
receiving a back-to-back second write access request to the first row of the first memory array; and
executing the second write access request to the transfer register.

5. A method in accordance with claim 1,
wherein the transfer register includes a first latch and a second latch,
wherein the first data access request to the first row of the first memory array is a first masked write access request:
wherein latching the bits of the first row of the first memory array to the transfer register further comprises latching the unmasked bits from the first masked write access request to the first latch of the transfer register;
wherein writing the bits latched to the transfer register to a corresponding first row in a second memory array of the DRAM further comprises writing the bits latched to the first latch of the transfer register to a corresponding first row in a second memory array of the DRAM; and
wherein the method further comprises:
executing a read to the first row in the first memory array;
simultaneously latching the masked bits in the first row to the first latch of the transfer register;
receiving a back-to-back second masked write access request to a second row in the first memory array;
latching the unmasked bits from the second masked write access request to the second latch of the transfer register;
executing a read to the second row in the first memory array;
simultaneously latching the masked bits in the first row to the first latch of the transfer register; and
writing the bits latched to the second latch of the transfer register to a corresponding second row in the second memory array of the DRAM.

6. A dynamic random access memory (DRAM), comprising:
a first bank, including:
a first memory array, including a plurality of addressable rows for storing data bits; and
a first write line driver logic coupled to the first memory array and operated to select an addressable row for data access based on a received decoded row signal;
a first IO sense amplifiers and write driver coupled to the first memory array and operated to sense the data bits of a selected addressable row in the first memory array and write the data bits to a global data bus, or receive data bits on the sense amplifiers and write the received data bits to the selected addressable row;
a second bank, including:
a corresponding second memory array, including a corresponding plurality of addressable rows for storing data bits; and
a second write line driver logic coupled to the second memory array and operated to select an addressable row for data access based on a received decoded row signal;
a second IO sense amplifiers and write driver coupled to the second memory array and operated to sense the data bits of a selected addressable row in the first memory array and write the data bits to a global data bus, or receive data bits on the sense amplifiers and write the received data bits to the selected addressable row;
the first bank further including a first transfer register, that includes a first latch and a second latch, and operated to latch data bits and coupled to the first IO sense amplifiers and write driver, the second IO sense amplifiers and write driver, and the global data bus;
the second bank further including a second transfer register, that includes a first latch and a second latch, and operated to latch data bits and coupled to the second IO sense amplifiers and write driver, the first IO sense amplifiers and write driver, and the global data bus;
a row decode logic coupled to the first and second write line driver logics and operated to receive from the global data bus a data access request for read or write to an addressable row, to decode the row from the request, and to assert the corresponding decoded row signal;
a bank select control logic coupled to the row decode logic, the first write line driver logic, and the second write line driver logic, and operated to enable either the first write line driver logic or the second write line driver logic based on the received decoded row signal; and
refresh logic operated to refresh the rows of the first memory array and the rows of the second memory, to pause a refresh operation in the rows of the first memory array and the second memory array in response to a data access request to a row of the first or second memory array, respectively, and to resume a paused refresh operation.

7. A DRAM in accordance with claim 6, wherein, in response to a first read access request to a first addressable row of the first memory array being asserted on the global data bus while the refresh logic is executing a refresh operation in the first memory array:

the refresh logic pausing the refresh operation in the first memory array;

the row decode logic receiving the first read access request, decoding the row from the request, and asserting a decoded row signal corresponding to the first addressable row;

the first and the second write line driver logics receiving the decoded first addressable row signal and selecting for data access the first addressable row in the first memory array, and the corresponding first addressable row in the second memory array;

the bank select control logic enabling the first write line driver logic;

the first IO sense amplifiers and write driver writing the data bits of the first addressable row in the first memory array to the global data bus;

the first transfer register latching the data bits of the first addressable row in the first memory array from the first IO sense amplifiers and write driver to the first latch of the first transfer register;

the second IO sense amplifiers and write river latching the data bits of the first addressable row in the first memory array from the first latch of the first transfer register and writing the latched bits to the corresponding first addressable row in the second memory array;

updating the bank select logic such that a received decoded row signal corresponding to the first addressable row will enable the second write line driver logic; and the refresh logic resuming the paused refresh operation.

8. A DRAM in accordance with claim 7, wherein, in response to a back-to-back second read access request to the first addressable row of the first memory array being asserted on the global data bus, the first transfer register writing the latched data bits in the first latch of the first transfer register onto the global data bus.

9. A DRAM in accordance with claim 7, wherein, in response to a back-to-back second read access request to a second addressable row of the first memory array being asserted on the global data bus:

the row decode logic receiving the second read access request, decoding the row from the request, and asserting a decoded row signal corresponding to the second addressable row;

the first and the second write line driver logics receiving the decoded second addressable row signal and selecting for data access the second addressable row in the first memory array, and the corresponding second addressable row in the second memory array;

the bank select control logic enabling the first write line driver logic;

the first IO sense amplifiers and write driver writing the data bits of the second addressable row in the first memory array to the global data bus;

the first transfer register latching the data bits of the second addressable row in the first memory array from the first IO sense amplifiers and write driver to the second latch of the first transfer register;

the second IO sense amplifiers and write driver latching the data bits of the second addressable row in the first memory array from the second latch of the first transfer register and writing the latched bits to the corresponding second addressable row in the second memory array; and updating the bank select logic such that a received decoded row signal corresponding to the second addressable row will enable the second write line driver logic.

10. A DRAM in accordance with claim 6, wherein, in response to a first masked write access request to a first addressable row of the first memory array being asserted on the global data bus while the refresh logic is executing a refresh operation in the first memory array:

the refresh logic pausing the refresh operation in the first memory array;

the first transfer register latching the unmasked data bits of the first addressable row in the first memory array from the global data bus to the first latch of the first transfer register;

the row decode logic receiving the first write access request, decoding the row from the request, and asserting a decoded row signal corresponding to the first addressable row;

the first and the second write line driver logics receiving the decoded first addressable row signal and selecting for data access the first addressable row in the first memory array, and the corresponding first addressable row in the second memory array;

the bank select control logic enabling the first write line driver logic;

the first transfer register latching the masked data bits of the first addressable row in the first memory array from the first IO sense amplifiers and write driver to the first latch of the first transfer register;

the second IO sense amplifiers and write river latching the data bits of the first addressable row in the first memory array from the first latch of the first transfer register and writing the latched bits to the corresponding first addressable row in the second memory array;

updating the bank select logic such that a received decoded row signal corresponding to the first addressable row will enable the second write line driver logic; and the refresh logic resuming the paused refresh operation.

11. A DRAM in accordance with claim 10, wherein, in response to a back-to-back second masked write access request to the first addressable row of the first memory array being asserted on the global data bus, the first transfer register latching the unmasked data bits of the first addressable row in the first memory array from the global data bus to the first latch of the first transfer register.

12. A DRAM in accordance with claim 10, wherein, in response to a back-to-back second masked write access request to a second addressable row of the first memory array being asserted on the global data bus:

the second transfer register latching the unmasked data bits of the second addressable row in the first memory array from the global data bus to the second latch of the first transfer register;

the row decode logic receiving the second write access request, decoding the row from the request, and asserting a decoded row signal corresponding to the second addressable row;

the first and the second write line driver logics receiving the decoded second addressable row signal and selecting for data access the second addressable row in the first memory array, and the corresponding second addressable row in the second memory array;

the bank select control logic enabling the first write line driver logic;

the first transfer register latching the masked data bits of the second addressable row in the first memory array from the first IO sense amplifiers and write driver to the second latch of the first transfer register;

the second IO sense amplifiers and write driver latching the data bits of the second addressable row in the first memory array from the second latch of the first transfer register and writing the latched bits to the corresponding second addressable row in the second memory array; and updating the bank select logic such that a received decoded row signal corresponding to the second addressable row will enable the second write line driver logic.

\* \* \* \* \*